United States Patent
Hollis (10) Patent No.: US 7,899,653 B2
(45) Date of Patent: Mar. 1, 2011

(54) MATRIX MODELING OF PARALLEL DATA STRUCTURES TO FACILITATE DATA ENCODING AND/OR JITTERY SIGNAL GENERATION

(75) Inventor: Timothy M. Hollis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 640 days.

(21) Appl. No.: 11/928,345

(22) Filed: Oct. 30, 2007

(65) Prior Publication Data

US 2009/0112551 A1  Apr. 30, 2009

(51) Int. Cl.
G06F 17/50 (2006.01)

(52) U.S. Cl. .................. 703/2; 703/14; 716/4
(58) Field of Classification Search .............. 703/2, 703/13, 14, 17, 19; 716/4, 6
See application file for complete search history.

(56) References Cited

U.S. PATENT DOCUMENTS

| | | | |
|---|---|---|---|
| 6,608,587 B1 * | 8/2003 | Sparrow et al. | 342/188 |
| 7,266,488 B1 * | 9/2007 | Wallace et al. | 703/14 |
| 7,280,412 B2 * | 10/2007 | Jang et al. | 365/189.07 |
| 7,477,999 B2 * | 1/2009 | Wegener | 702/66 |
| 2006/0067141 A1 * | 3/2006 | Perego et al. | 365/200 |

OTHER PUBLICATIONS

U.S. Appl. No. 11/549,646, filed Oct. 14, 2006, Hollis.
U.S. Appl. No. 11/738,193, filed Apr. 20, 2007, Hollis.
U.S. Appl. No. 11/926,682, filed Oct. 29, 2007, Hollis.

* cited by examiner

*Primary Examiner*—Dwin M Craig
(74) *Attorney, Agent, or Firm*—Wong, Cabello, Lutsch, Rutherford & Brucculeri, LLP (57) ABSTRACT

A computer-implementable method comprises a matrix-based approach to generating in parallel a plurality of realistic simulatable signal vectors, which vectors include the addition of amplitude noise and/or timing jitter and encoding. Each channel in a parallel bus can be populated in a matrix, with each row comprising ideal voltage values for the channel, and the columns comprising bits of the sequence of voltage values for that channel. Encoding can be employed to modify the data in the matrix. Amplitude noise and/or timing jitter can then be applied to each channel (row) in the matrix. This modifies the time basis from a bit basis as used in the matrix to a time-step basis. With such modification accomplished, each row in the matrix can be transformed into simulatable vector, which vectors can then be simulated in parallel to test, the robustness of the parallel bus of which the channels are part.

22 Claims, 6 Drawing Sheets

MATRIX MODELING OF PARALLEL DATA STRUCTURES TO FACILITATE DATA ENCODING AND/OR JITTERY SIGNAL GENERATION

FIELD OF THE INVENTION

Embodiments of this invention relate to the generation of realistic simulatable signals for simulating the transmission of data on a parallel bus.

BACKGROUND

Circuit designers of multi-Gigabit systems face a number of challenges as advances in technology mandate increased performance in high-speed components. For example, chip-to-chip data rates have traditionally been constrained by the bandwidth of input/output (I/O) circuitry in each component. However, process enhancements and innovations in I/O circuitry have forced designers to also consider the effects of the transmission channels between the chips on which data is sent.

Figure 1A:
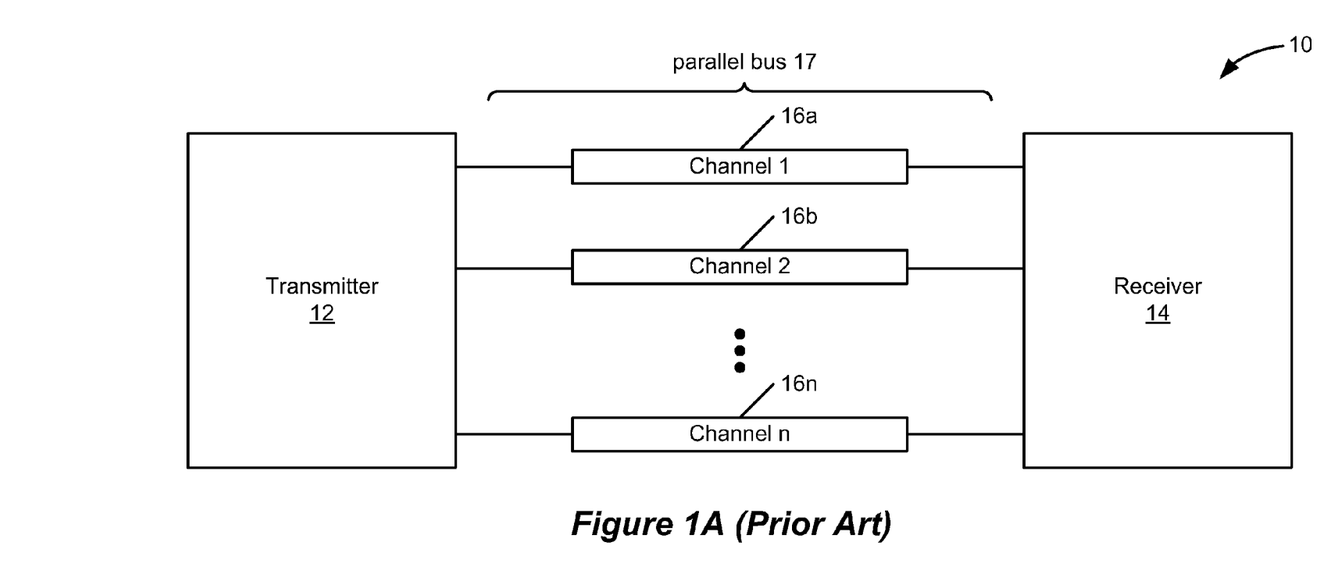
FIG. 1A illustrates a basic transmitter/receiver system for digital data.

At a basic level, data transmission between components within a single semiconductor device, or between two devices on a printed circuit board, may be represented by the system 10 shown in FIG. 1A. In FIG. 1A, a transmitter 12 (e.g., a microprocessor) sends data over a parallel bus 17 of channels 16 (e.g., copper traces on a printed circuit board or "on-chip" in a semiconductor device) to a receiver 14 (e.g., another processor or memory). When data is sent from an ideal transmitter 12 to a receiver 14 across ideal (lossless) channels 16, all of the energy in a transmitted pulse will be contained within a single time cell, which is often referred to as a unit interval (UI).

Figure 1B:
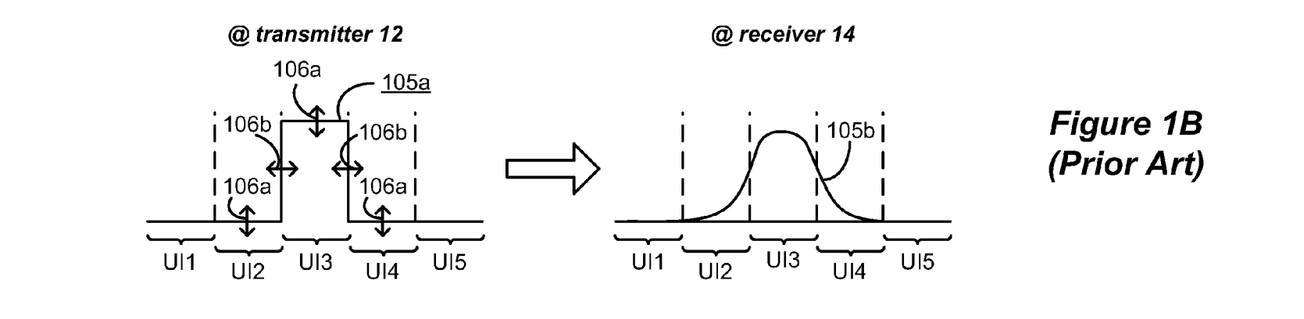
FIG. 1B illustrates how Inter-symbol Interference (ISI) affects an otherwise ideal pulse as it travels down a non-ideal channel, as well as the impact of amplitude noise and/or timing jitter on an otherwise ideal pulse.

However, real transmitters and real transmission channels do not exhibit ideal characteristics. Due to a number of factors, including, for example, the limited conductivity of copper traces, the dielectric medium of the printed circuit board (PCB), and the discontinuities introduced by vias, the initially well-defined digital pulse will tend to spread or disperse as it passes through a particular channel 16. This is shown in FIG. 1B. As shown, a single pulse of data 105a is sent by the transmitter 12 during a given UI (e.g., UI3). However, because of the effect of the channel 16, this data pulse becomes spread 105b over multiple UIs at the receiver 14, i.e., some portion of the energy of the pulse is observed outside of the UI in which the pulse was sent (e.g., in UI2 and UI4). This residual energy outside of the UI of interest may perturb a pulse otherwise occupying the neighboring UIs, in a phenomenon referred to as intersymbol interference (ISI).

Because of the potentially negative impact of ISI on the reliability of data transfer and detection at the receiver 14, it is important to simulate such data transfer in a computer system using simulation software. Simulation software allows the circuit designer to verify the operation and margins of a circuit design before incurring the expense of actually building and testing the circuit. Simulation is particularly important in the semiconductor industry, where it is generally very expensive to design and produce a given integrated circuit. Through the use of such simulations, design errors or risks are hopefully identified early in the design process, and resolved prior to fabrication.

A practical issue that confounds meaningful simulation is the reality of amplitude noise 106a and/or timing jitter 106b, as shown in FIG. 1B. Signals in any channel experience both random and deterministic amplitude noise and/or timing jitter. Random deviation, in the form of random Gaussian distributed amplitude noise and/or timing jitter stemming from thermal and shot noise, requires statistical quantification. Similarly, deterministic amplitude noise and/or timing jitter are linked to several sources including power supply noise, inter-channel crosstalk, impedance discontinuities, component variance, and at high frequencies the response of the channel, resulting in a variety of observable characteristics, from periodicity to uncorrelated-bounded randomness. To model amplitude noise 106a and/or timing jitter 106b correctly requires the ability to superimpose these effects into a simluatable signal in a way reflecting what occurs in the actual system.

The generation of realistic simulatable signals is exacerbated when the simulation involves not just transmission through a single channel, but rather requires simulation across multiple channels 16 in a parallel bus 17 (comprising, for example, 8, 16, or 32 parallel channels, etc.). Just as is it beneficial to simulate a statistically significant number of bits, it is also beneficial to simulate transmission of signals through a statistically significant number of channels 16 in the bus 17, if not all channels in the bus. This is because of the reality of cross-talk between channels 16 in the bus 17 and simultaneous switching noise (SSN) induced in the power supply distribution: i.e., one channel's signal and supply current draw may affect a signal on another channel.

Still another factor making simulation difficult is the reality that various types of data, prior to being transmitted, may require some type of encoding. For example, data bus inversion can work an inversion in some of the data on the channels in the bus prior to their transmission, which inversion is then undone or decoded at the receiver to recover the original data. See, e.g., U.S. patent application Ser. No. 11/873,779, filed Oct. 17, 2007, which is incorporated by reference in its entirety. One skilled in the art will recognize that other forms of encoding of signals in a parallel bus are also possible. In any event, understanding that the data will be encoded in an actual system further complicates the generation of simulatable signals.

With the following background in hand, it should be apparent that improved techniques are needed to quickly generate realistic simulation vectors to enable the simulation of the transmission of encoded data, which may or may not simultaneously exhibit amplitude noise and/or timing jitter, through a parallel bus. The disclosed technique provides such a solution.

DETAILED DESCRIPTION

One or more embodiments of the disclosed computer-implementable method comprise a matrix-based approach to generating in parallel a plurality of realistic simulatable signal vectors, which vectors include the addition of amplitude noise and/or timing jitter and encoding. A plurality of channels in a parallel bus are first populated in a matrix, with each row of the matrix comprising ideal voltage values representative of distinct bits in the plurality of bit streams to be transmitted across the plurality of distinct channels in the parallel bus, and with each column in the matrix representing a single bit in time of the plurality of parallel bit streams. Thereafter, encoding can be employed to modify the data in the matrix. Amplitude noise and/or timing jitter can then be applied to each channel (row) in the matrix. This modifies the time basis from a bit basis as used in the matrix to a time-step basis. With such modification accomplished, each row in the matrix can be transformed into simulatable vector, which vectors can then be simulated in parallel to test, for example, the robustness of the parallel bus of which the channels are a part.

Figure 2:
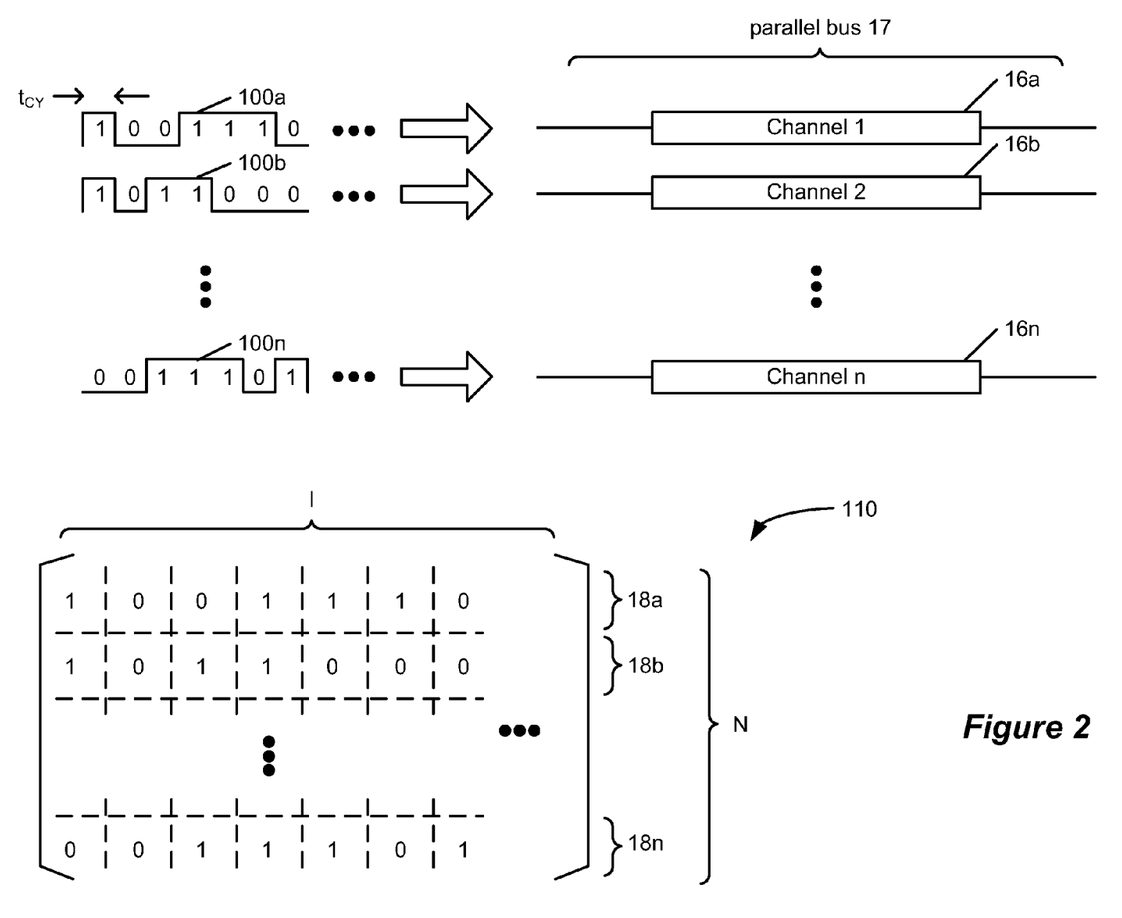
FIG. 2 illustrates the population of a matrix with various parallel bit streams in accordance with a first step of the disclosed technique.
Figure 5:
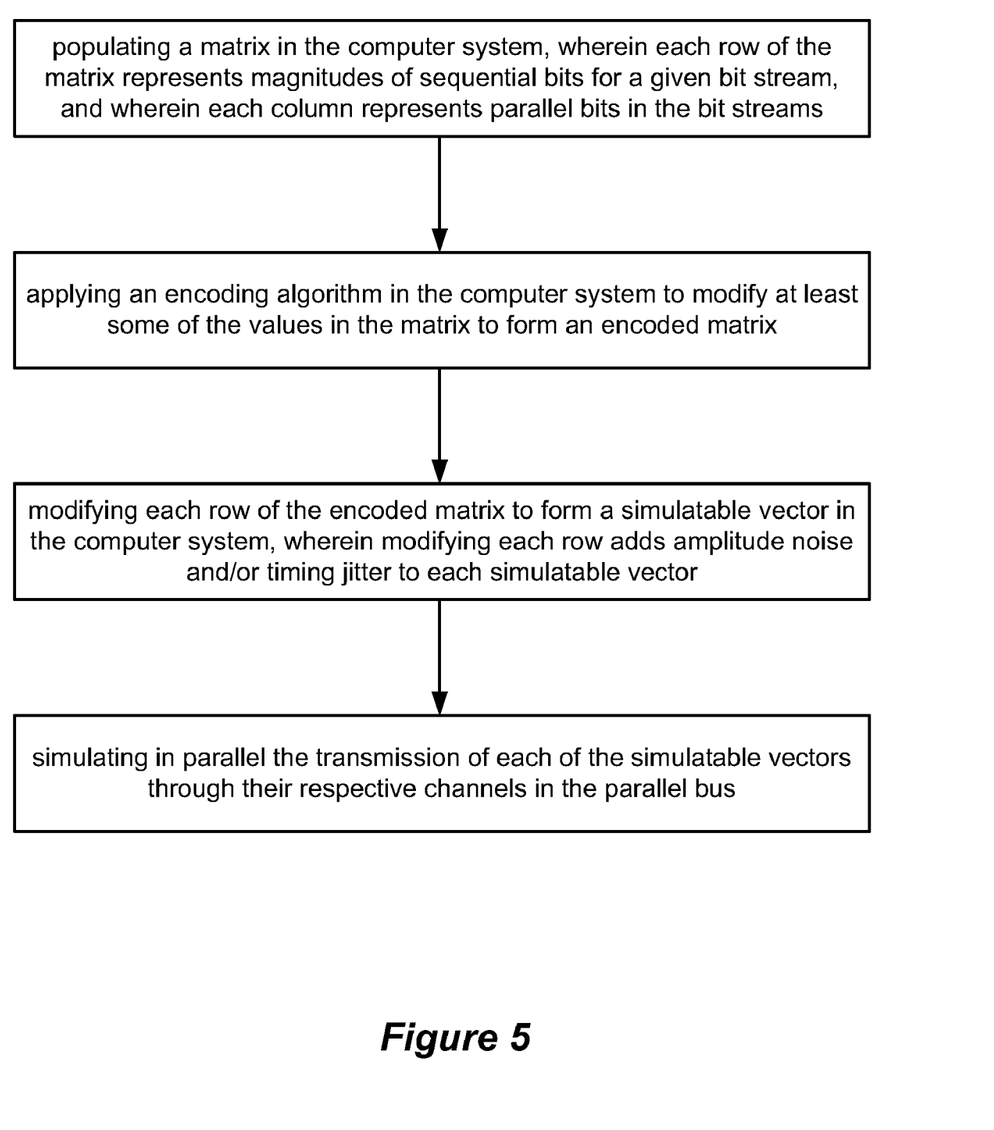
FIG. 5 illustrates a flow chart of the computer-implementable steps of the method as reflected in FIGS. 4-6.

Explanation of an embodiment of the disclosed technique is summarized in flow-chart form in FIG. 5, but can be appreciated in more detail starting with FIG. 2. FIG. 2 shows various bit streams 100, which the designer has decided requires simultaneous simulation through corresponding channels 16a-16n (see FIG. 1A). Although such bits are shown as comprising traditional bits with binary values, it should be understood that the bits may take on any magnitude values which deviate from ideal levels.

These bit streams 100 are divided on a per-bit basis with each bit having a duration of $t_{CY}$. One might assume that each bit stream 100 comprises a randomized sequence of bits, which is a sensible assumption because the goal of the impending simulation will be to simulate the robustness of the parallel bus 17 and related transmit and receive circuitry. However, these starting bit streams 100 can be derived on any logical basis depending on the expected patterns of data on the bus 17. For example, it is well understood that certain pattern combinations occurring across the width of the parallel bus will lead to the worst case crosstalk and SSN behavior. More specifically, the worst case crosstalk is induced when every bit across the channel changes in the same direction at the same time, and the worst case SSN is experienced when all but one bit transition together in one direction while the single bit transitions in the opposite direction at the same time.

Each of these bit streams 100a-n is populated into corresponding rows 18a-n in a matrix 110. The matrix 110 can be defined in a module associated with the simulation software, or with any module with which the simulation software is compatible. For example, MatLab™ can be used in one example as the software module for defining, populating, and processing the matrix 110, because of its easy compatibility with simulation software module such as Spice™. As can be seen, each column in the matrix 110 comprises a bit in the corresponding bit stream 100, and each value in the matrix represents a magnitude of the voltage of a distinct bit in a distinct sequence. As shown, there are 'I' columns in the matrix 110, where it is assumed that 'I' comprises a statistically significant number of bits for simulation.

As shown, for simplicity, the values in the matrix 110 are exactly 0V and 1V to match the logic values of '0' and '1' in the bit stream. Using voltages of this magnitude would be logical in a system 10 in which the main power supply, Vcc, equals 1 Volt. However, in systems employing different power supply voltages, the values in the matrix 110 may vary from 0 and 1, and can otherwise comprise scaled or normalized values.

Because the matrix 110 comprises a full population of all of the bits in the various bit streams 100a-n, such data can be evaluated in its totality and subject to encoding prior to the generation of simulatable vectors. The ability to make a full assessment of the data, and encode it in a manner reflective of actual encoding that takes place in the transmitter 12 (FIG. 1A), can be a significant benefit of the disclosed matrix-based simulation approach. Absent matrix-based processing, where simulatable signals are otherwise built independently for each channel, certain forms of encoding cannot be employed, because the data states in other channels would not be known or considered.

An additional benefit of generating multiple parallel signals in the form of a matrix, is that it can provide control over the bit to bit correlation not only with respect to time along a single channel, but with respect to space as well, as the correlation or lack thereof between bits at any two point in the matrix is explicitly controllable. This is significant, because it is not uncommon for a designer to produce a single bit sequence associated with a single channel, and then simply repeat that sequence when desiring to simulate parallel signals on a bus. This is of course unrealistic because it implies identical signals across the bus. To add realism, designers may reuse the original bit sequence, but impose a shift in the copied version(s) of the sequence, such that the bit pattern no longer is aligned across the width of the bus. This is an improvement, but still leads to a larger measure of correlation between the bits on the neighboring channels, which is still unrepresentative of the truly random nature of parallel bus signals. Thus the ability to generate bus-wide data patterns that are uncorrelated both in time (along a single channel) and in space (between distinct channels across the bus) can allow for realistic simulation.

Figure 3:
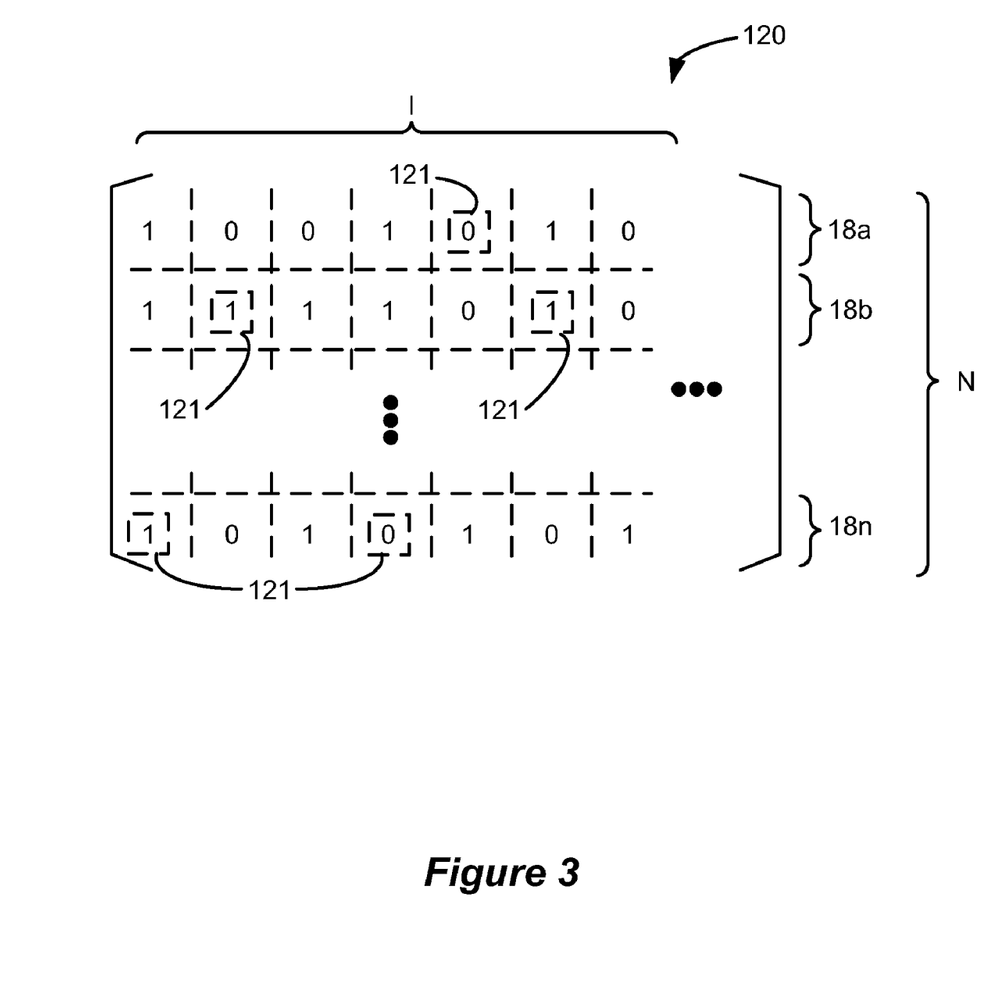
FIG. 3 illustrates modification of the matrix of FIG. 2 to include data encoding.

Encoding is depicted generally in FIG. 3. As shown, some of the values in the matrix 121 have been changed to populate a new encoded matrix 120. Encoding can occur in accordance with many different algorithms, as one skilled in the art will understand. In one example, data bus inversion encoding can be employed prior to transmission across the bus 17. Such a scheme analyzes parallel bits in each of the bit streams 100 (i.e., each column of matrix 110) and if necessary inverts some or all of the parallel bits to achieve a certain end. For example, bit inversion made lead to a better balance of the logic states across the bus, or a reduction in transitions, or a bias toward favoring one specific binary state in the transmission. Such a scheme also simultaneously transmits a control bit to inform the receiver 14 whether inversion has taken place so that the data can then be properly decoded (recovered). Data bus inversion schemes are discussed further in U.S. patent application Ser. No. 11/873,779, which was incorporated above. While use of a data bus inversion encoding algorithm is disclosed, any encoding algorithm can be used that is, for example, designed to improve reliability of the intended transmission of the bit streams 100 down the channels 16 in the parallel bus 17.

Implementation of encoding at this stage is generally easily achieved using the mathematical abilities generally inherent in the software module used to populate and process the matrix. For example, when MatLab is used as the module, MatLab's various functions allow the sort of if/then analysis of the data to decide which bits, if any will need encoding in the population of matrix 120. This can allow for rapid comparison of the impact of multiple bit inversion algorithms or alternative encoding algorithms on the overall signal integrity and/or power consumption of the interface.

While data bus inversion is emphasized in this discussion, it should be understood that several encoding techniques could benefit from the matrix-based modeling being proposed. For example, conversion from standard non-return-to-zero (NRZ) data to multi-level pulse-amplitude-modulation can also be simplified through these methods.

Figure 4:
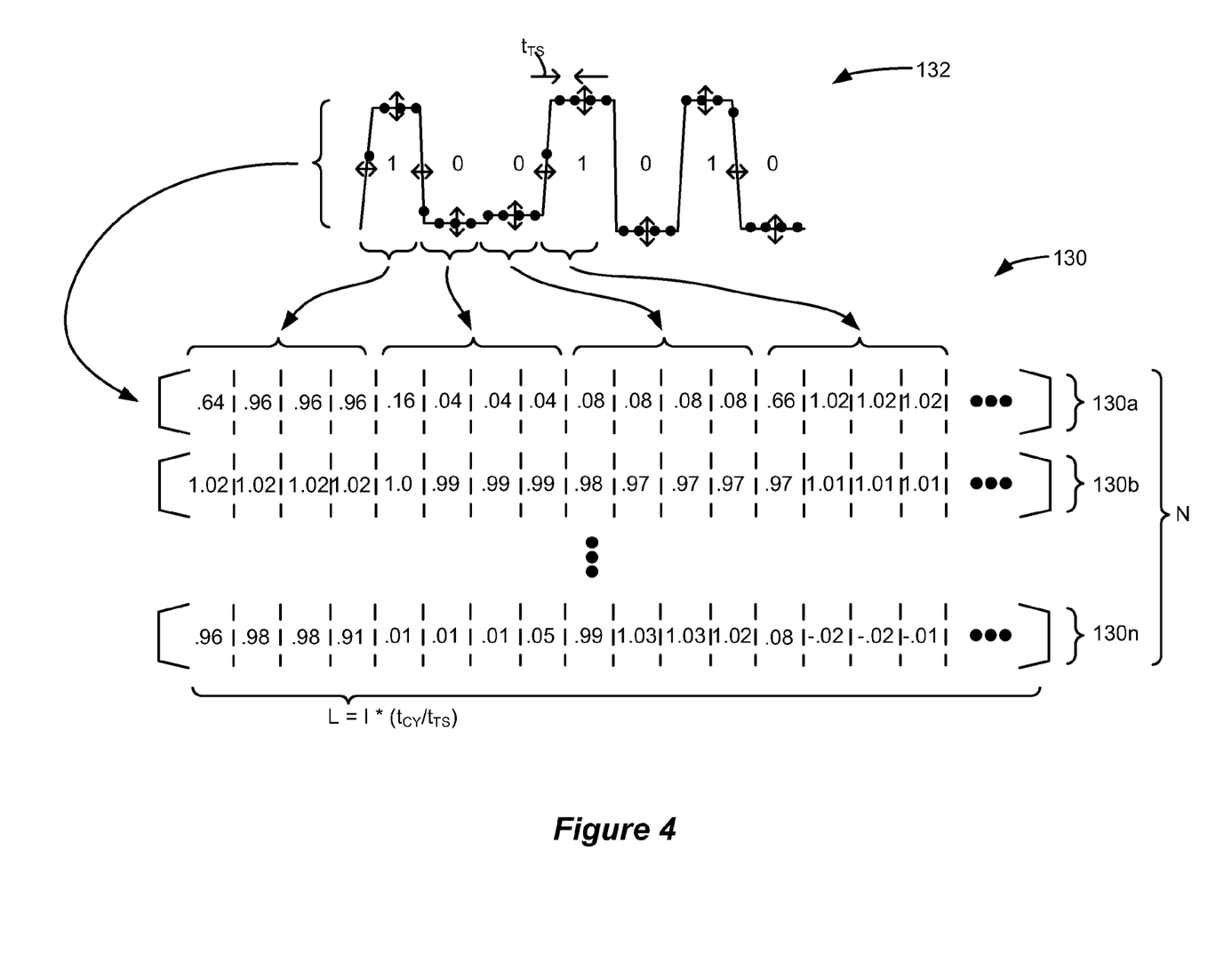
FIG. 4 illustrates the generation of simulatable vectors from the encoded matrix of FIG. 3, in which the vectors are time-step based and have been modified to incorporate amplitude noise and/or timing jitter.

After encoding, simulatable vectors 130a-n are derived from the encoded matrix 120, as shown in FIG. 4. During this step, the time basis changes from a bit basis (matrix 120) to a time step basis (vectors 130a-n). The time step is resolution compliant with the simulation module to define incremental steps in a waveform. As one would expect, the time step is normally much smaller in duration ($t_{TS}$) than the duration of a given bit ($t_{CY}$). As a result, the time-step-based vectors 130a-n would typically have many more entries L than there are columns in the bit-based matrix 120 of FIG. 3. To quantify this difference, the number of entries L in the time-step-based matrix 130 comprises $L=I*(t_{CY}/t_{TS})$.

In one or more embodiments, amplitude noise and/or timing jitter is reflected in the simulatable vectors 130a-n, and the process for adding such amplitude noise and/or timing jitter can work the bit-based to time-step-based conversion. As noted earlier, it is of great benefit to an accurate characterization of the system being simulated that the simulation vectors be as realistic as possible, and hence include the realistic effects of amplitude noise and/or timing jitter. Because such amplitude noise and/or timing jitter usually can be quite small, the time-step based data construct helps resolve these differences.

Modification of the bit-based matrix 120 to include amplitude noise and/or timing jitter in the vectors 130a-n can occur in many different ways, but one computationally-efficient way is disclosed in U.S. patent application Ser. No. 11/549,646, filed Oct. 14, 2006, incorporated above. This '646 application describes how a bit stream can be converted to a time-step-based vector suitable for simulation while adding a "time-domain aspect" (such as amplitude noise and/or timing jitter) which varies randomly or deterministically between the cycles. Without fully reiterating the '686 application here, a technique disclosed there includes providing at least one time-domain aspect of the input waveform into the computer system for each cycle of the input waveform, in which the time-domain aspect varies randomly between the cycles. Again, this time-domain aspect can be any expected variance in the signal, such as amplitude noise, timing jitter, or other variables. Next, a set of Fourier transform coefficients is calculated for each cycle of the input waveform using a finite number of harmonic frequencies, in which the transform coefficients are calculated as a function of the at least one time-domain aspect of the waveform. From this, a time-domain cycle is computed for each set of transform coefficients. Finally, the time-step-based simulatable vector is created by concatenating the plurality of time-domain cycles. Using such a technique it is possible to form vectors in which the amplitude noise and/or timing jitter varies randomly between each bit in the simulatable vectors.

Amplitude noise and/or timing jitter may also be added to the matrix 120 using the techniques disclosed in U.S. patent application Ser. No. 11/926,682, filed Oct. 29, 2007, which is hereby incorporated by reference.

Additionally, periodic jitter (i.e., jitter that varies predictably from cycle to cycle) can also be added when converting from the matrix 120 to the vectors 130a-n, as disclosed in U.S. patent application Ser. No. 11/738,193, filed Apr. 20, 2007, which is hereby incorporated by reference in its entirety. To briefly review one embodiment of a technique disclosed in the '193 application, a simulatable vector is generated by first determining a time shift value for each of a plurality of cycles of a signal to be simulated, in which the time shift values vary periodically between the plurality of cycles, and wherein the time shift values are further phase shifted by a phase shift in each of the cycles. Next, each determined time shift value is applied to create a time shifted vector for each of the plurality of cycles, wherein each time shifted vector comprises a sequence of voltage values each separated by a time step. Finally, the plurality of time shifted vectors are concatenated to create the multi-cycle signal vector.

Ultimately, it is not particularly important the exact method used to add amplitude noise and/or timing jitter in the formation of the vectors 130a-n. Therefore, the above-incorporated techniques should be understood as merely examples.

To reiterate, each of the simulatable vectors 130a-n reflect the results of encoding, have amplitude noise and/or timing jitter applied thereto, and are defined on a time step basis. The addition of amplitude noise and/or timing jitter in particular is illustrated in FIG. 4 by depicting a waveform 132 that vector 130a represents. As can be seen, that waveform 132 deviates from ideal values because of the addition of amplitude noise and/or timing jitter to the signal.

While shown in FIG. 4 as a plurality of vectors 130a-n derived from a matrix 120, the vectors 130a-n may, together, also be considered as a matrix of time-step based values, with each vector 130a-n comprising a row in the matrix. However, because the goal of the technique is to provide for the creation of simulatable vectors, the formality of a matrix at this point in the process is not necessary.

At this point, vectors 130a-n can be used in parallel to simulate transmission though the channels 16 (FIG. 1A). As noted earlier, parallel simulation of the vectors can be used to understand the effects of crosstalk and simultaneous switching noise (SSN) on the system being modeled. Such a simulation may be used to determine a bit error rate at the receiver 14 for each of the channels 16, and/or to determine suitable sensing margins for each channel. Depending on the results of such a simulation, modifications can be made to the transmitter 12, bus 17, receiver 14, or even the encoding scheme prior to fabrication of the system 10, thus improving reliability. One potential simulation module at this stage in the process is Spice™, wherein the time step of the simulatable vectors 130a-n can be compliant with the time step specified in the Spice module.

A matrix 120 or 130 can be employed in the generation of the simulatable vectors 130a-n. Such a data structure allows for easy understanding of the entirety of the data. However, while use of a matrix data structure may facilitate the analysis and the application of the encoding algorithm, it is not strictly required. Instead, the bit streams 100a-n may be processed, and the encoding algorithm applied, even if an integrated data structure such as a matrix is not used. The data structures used can be of any type, as long as the encoding algorithm can operate based on an assessment of all of the bit streams.

One skilled in the art will realize that the disclosed techniques are usefully implemented as software running on a computer system, and ultimately stored in a computerized-readable media, such as a disk, semiconductor memory, or other media discussed below. Such a computer system can be broadly construed as any machine or system of machines capable or useful in reading and executing instructions in the software program and making the various computations embodiments of the disclosed techniques require. Usually, embodiments of the disclosed techniques would be implemented as programs installable on a circuit designer's workstation or work server. Moreover, embodiments of the disclosed techniques can easily be incorporated into pre-existing circuit simulation software packages, such as those mentioned previously.

One skilled in the art will further realize that although illustrated as separate steps here, the steps of applying an encoding algorithm and subsequently modifying each row of the encoded matrix to form a simulatable vector in the computer system can be performed in a single step in a particular implementation. In other words, these steps do not have to be performed distinctly to come within the scope of the below claims.

"Noise" as used herein should be interpreted as including amplitude noise and/or timing jitter, and may include other types of noise as well.

Figure 6:
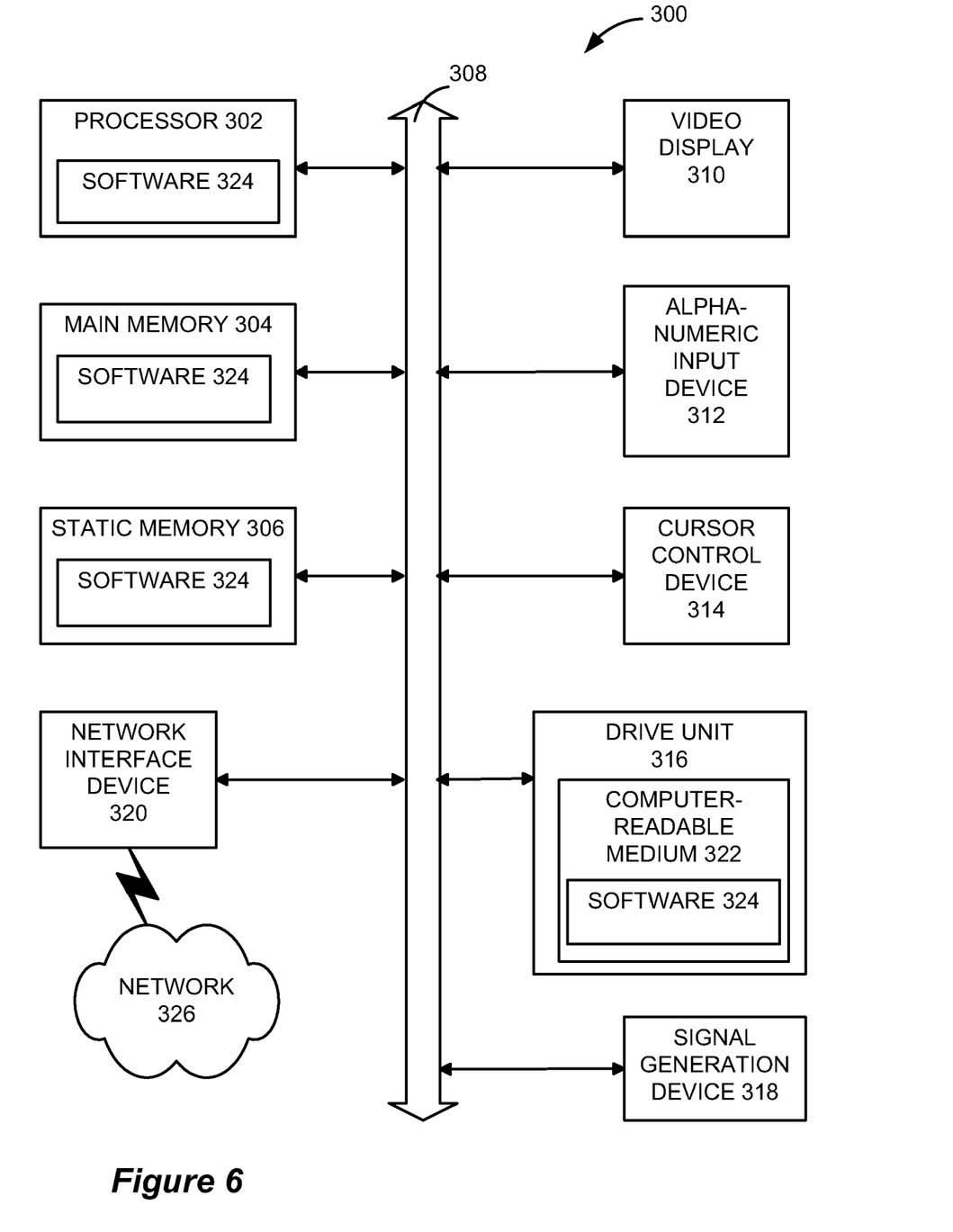
FIG. 6 illustrates a computer system in which the disclosed technique can be implemented.

FIG. 6 is a block diagram of an exemplary computer system 300 within which a set of instructions, for causing the machine to perform any one or more of the techniques described herein, may be executed. In alternative embodiments, the computer system 300 operates as a standalone device or may be connected (e.g., networked) to other computer systems. In a networked deployment, the system 300 may operate in the capacity of a server or a client machine in a server-client network environment, or as a peer machine in a peer-to-peer (or distributed) network environment. The computer system 300 may be a personal computer (PC), a workstation such as those typically used by circuit designers, a set-top box (STB), a Personal Digital Assistant (PDA), a cellular telephone, a web appliance, a network router, switch or bridge, or any machine capable of executing a set of instructions that specify actions to be taken by that machine, and networked versions of these.

The exemplary computer system 300 includes a processor 302 (e.g., a central processing unit (CPU), a graphics processing unit (GPU) or both), a main memory 304 and a static memory 306, which communicate with each other via a bus 308. The computer system 300 may further include a video display unit 310 (e.g., a liquid crystal display (LCD) or a cathode ray tube (CRT)). The computer system 300 also includes an alphanumeric input device 312 (e.g., a keyboard), a user interface (UI) navigation device 314 (e.g., a mouse), a disk drive unit 316, a signal generation device 318 (e.g., a speaker) and a network interface device 320.

The disk drive unit 316 includes a computer-readable medium 322 on which is stored one or more sets of instructions and/or data structures (e.g., software 324) embodying embodiment of the various techniques disclosed herein. The software 324 may also reside, completely or at least partially, within the main memory 304 and/or within the processor 302 during execution thereof by the computer system 300, the main memory 304 and the processor 302 also constituting computer-readable media.

The software 324 and/or its associated data may further be transmitted or received over a network 326 via the network interface device 320 utilizing any one of a number of well-known transfer protocols (e.g., HTTP).

While the computer-readable medium 322 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the disclosed techniques, or that is capable of storing, encoding or carrying data structures utilized by or associated with such a set of instructions. The term "computer-readable medium" shall accordingly be taken to include, but not be limited to, solid-state memories, optical and magnetic media such as discs, and carrier wave signals.

Embodiments of the disclosed techniques can also be implemented in digital electronic circuitry, in computer hardware, in firmware, in special purpose logic circuitry such as an FPGA (field programmable gate array) or an ASIC (application-specific integrated circuit), in software, or in combinations of them, which again all comprise examples of "computer-readable media." When implemented as software, such software can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors 302 suitable for the execution of a computer program include, by way of example, both general and special purpose microprocessors, and any one or more processors of any kind of digital computer. Generally, a processor will receive instructions and data from a read-only memory or a random access memory or both.

To provide for interaction with a user, the invention can be implemented on a computer having a video display 310 for displaying information to the user and a keyboard and a pointing device such as a mouse or a trackball by which the user can provide input to the computer. Other kinds of devices can be used to provide for interaction with a user as well. For example, feedback provided to the user can be any form of sensory feedback, such as visual feedback, auditory feedback, or tactile feedback; and input from the user can be received in any form, including acoustic, speech, or tactile input.

Aspects of the disclose techniques can employ any form of communication network. Examples of communication networks 326 include a local area network ("LAN"), a wide area network ("WAN"), and the Internet.

It should be understood that the disclosed techniques can be implemented in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A method implementable in a computer system for generating a plurality of simulatable vectors, comprising:
    providing a matrix in the computer system, wherein each row of the matrix represents magnitudes of sequential bits for a given bit stream, and wherein each column represents parallel bits in the bit streams, and wherein each bit stream models an intended transmission through a channel in a parallel bus;
    applying an encoding algorithm in the computer system to modify at least some of the values in the matrix to form an encoded matrix; and
    modifying each row of the encoded matrix to form a simulatable vector in the computer system, wherein modifying each row adds noise to each simulatable vector.

2. The method of claim 1, wherein the simulatable vectors are time-step based.

3. The method of claim 1, wherein the encoding algorithm comprises a data bus inversion algorithm.

4. The method of claim 1, wherein the method is performed using a software module different from a simulation module.

5. The method of claim 1, wherein the noise varies randomly between each bit in the simulatable vectors.

6. A method implementable in a computer system for generating a plurality of simulatable vectors, comprising:
  providing a plurality of bit streams in the computer system, each bit stream having a plurality of sequential bits with each bit having a magnitude, wherein each bit stream models an intended transmission through a channel in a parallel bus;
  applying an encoding algorithm in the computer system to modify at least some of the magnitudes in at least some of the bit streams, wherein the encoding algorithm improves reliability of the intended transmission of the bit streams through the channels in the parallel bus; and
  applying in the computer system noise to each of the bit streams to create simulatable vectors ready for simulation in a simulation module in the computer system.

7. The method of claim 6, wherein the simulatable vectors are time-step based.

8. The method of claim 6, wherein the encoding algorithm assesses parallel bits in the bit streams.

9. The method of claim 6, wherein the encoding algorithm comprises conversion to multi-level pulse-amplitude-modulated data.

10. The method of claim 6, wherein the noise varies randomly between each bit in the simulatable vectors.

11. The method of claim 6, wherein the encoding algorithm comprises a data bus inversion algorithm.

12. A method implementable in a computer system for simulating the operation of a parallel bus, comprising:
  providing a matrix in the computer system, wherein each row of the matrix represents magnitudes of sequential bits for a given bit stream, and wherein each column represents parallel bits in the bit streams;
  applying an encoding algorithm in the computer system to modify at least some of the values in the matrix to form an encoded matrix;
  modifying each row of the encoded matrix to form a simulatable vector in the computer system, wherein modifying each row adds noise to each simulatable vector; and
  simulating in parallel the transmission of each of the simulatable vectors through their respective channels in the parallel bus.

13. The method of claim 12, wherein the encoding algorithm comprises conversion to multi-level pulse-amplitude-modulated data.

14. The method of claim 12, wherein the simulating step is performed using a software module not used by other steps in the method.

15. The method of claim 12, wherein the noise varies randomly between each bit in the simulatable vectors.

16. The method of claim 12, wherein the encoding algorithm comprises a data bus inversion algorithm.

17. A method implementable in a computer system for simulating the operation of a parallel bus, comprising:
  providing a plurality of bit streams in the computer system, each bit stream having a plurality of sequential bits with each bit having a magnitude;
  applying an encoding algorithm in the computer system to modify at least some of the magnitudes in at least some of the bit streams, wherein the encoding algorithm improves reliability of the intended transmission of the bit streams through the channels in the parallel bus;
  applying in the computer system noise to each of the bit streams to create simulatable vectors ready for simulation in a simulation module in the computer system; and
  simulating in parallel the transmission of each of the simulatable vectors through their respective channels in the parallel bus.

18. The method of claim 17, wherein the simulatable vectors are time-step based.

19. The method of claim 17, wherein the encoding algorithm assesses parallel bits in the bit streams.

20. The method of claim 17, wherein the encoding algorithm comprises a data bus inversion algorithm.

21. The method of claim 17, wherein the noise varies randomly between each bit in the simulatable vectors.

22. The method of claim 17, wherein the encoding algorithm comprises conversion to multi-level pulse-amplitude-modulated data.

* * * * *

UNITED STATES PATENT AND TRADEMARK OFFICE
CERTIFICATE OF CORRECTION

PATENT NO. : 7,899,653 B2  Page 1 of 1
APPLICATION NO. : 11/928345
DATED : March 1, 2011
INVENTOR(S) : Timothy M. Hollis It is certified that error appears in the above-identified patent and that said Letters Patent is hereby corrected as shown below:

On the Title page, in field (57), under "Abstract", in column 2, line 14, delete "test," and insert -- test --, therefor.

Signed and Sealed this
Nineteenth Day of April, 2011

David J. Kappos
*Director of the United States Patent and Trademark Office*